United States Patent
Gregory et al.

(10) Patent No.: US 6,316,276 B1
(45) Date of Patent: Nov. 13, 2001

(54) APPARATUS AND METHOD OF PLANARIZING A SEMICONDUCTOR WAFER THAT INCLUDES A FIRST REFLECTIVE SUBSTANCE AND A SECOND REFLECTIVE SUBSTANCE

(75) Inventors: John W. Gregory; Derryl D. J. Allman, both of Colorado Springs, CO (US)

(73) Assignee: LSI Lgoic Corporation, Milpitas, CA (US)

( * ) Notice: Subject to any disclaimer, the term of this patent is extended or adjusted under 35 U.S.C. 154(b) by 0 days.

(21) Appl. No.: 09/213,803

(22) Filed: Dec. 17, 1998

(51) Int. Cl.[7] .................................................. H01L 21/00
(52) U.S. Cl. .................................. 438/8; 216/38; 216/85; 216/88; 438/692; 438/745
(58) Field of Search .................................. 438/8, 14, 691, 438/692, 693, 745, 747; 216/38, 84, 88, 85, 89, 91

(56) References Cited

U.S. PATENT DOCUMENTS

| | | | |
|---|---|---|---|
| 5,439,551 | 8/1995 | Meikle et al. | 156/626.1 |
| 5,663,101 | 9/1997 | Cronin | 438/637 |
| 5,663,797 | 9/1997 | Sandhu | 438/16 |
| 5,691,253 | 11/1997 | Kobayashi | 438/690 |
| 5,695,660 | 12/1997 | Litvak | 216/85 |
| 5,712,185 | 1/1998 | Tsai et al. | 437/67 |
| 5,736,462 | 4/1998 | Takahashi et al. | 438/692 |
| 5,747,380 | 5/1998 | Yu et al. | 438/599 |

Primary Examiner—William A. Powell

(57) ABSTRACT

A method of planarizing a semiconductor that includes (i) a substrate material, (ii) a first reflective substance positioned on the substrate material, (iii) an intermediate material positioned on the first reflective substance, wherein a channel is defined in a structure which includes the substrate, the first reflective substance, and the intermediate material, and (iv) a second reflective substance positioned on the intermediate material and in the channel is disclosed. The method includes the steps of (i) directing light onto a first side of the semiconductor wafer, (ii) polishing the first side of the semiconductor wafer in order to remove matter therefrom and expose the first reflective substance, the matter including the second reflective substance and the intermediate material, (iii) detecting when light directed in the directing step is simultaneously reflected by (A) the first reflective substance positioned on the substrate, and (B) the second reflective substance positioned in the channel, and generating an endpoint detection signal in response thereto, and (iv) terminating the polishing step in response to generation of the endpoint detection signal. An associated apparatus is also disclosed.

20 Claims, 5 Drawing Sheets

APPARATUS AND METHOD OF PLANARIZING A SEMICONDUCTOR WAFER THAT INCLUDES A FIRST REFLECTIVE SUBSTANCE AND A SECOND REFLECTIVE SUBSTANCE

TECHNICAL FIELD OF THE INVENTION

The present invention relates generally to an apparatus and method of planarizing a semiconductor wafer, and more particularly to an apparatus and method of planarizing a semiconductor wafer which includes a first reflective substance and a second reflective substance.

BACKGROUND OF THE INVENTION

Semiconductor integrated circuits are typically fabricated by a layering process in which several layers of material are fabricated on or in a surface of a semiconductor wafer, or alternatively, on a surface of a previous layer. This fabrication process typically requires subsequent layers to be fabricated upon a smooth, planar surface of a previous layer. However, the surface topography of layers may be uneven due to an uneven topography associated with an underlying layer. As a result, a layer may need to be polished in order to present a smooth, planar surface for a subsequent processing step. For example, a layer may need to be polished prior to formation of a conductor layer or pattern on an outer surface of the layer.

In general, a semiconductor wafer may be polished to remove high topography and surface defects such as scratches, roughness, or embedded particles of dirt or dust. The polishing process can be accomplished with a polishing system that includes top and bottom platens (e.g. a polishing table and a wafer carrier or holder), between which the semiconductor wafer is positioned. The platens are moved relative to each other thereby causing material to be removed from the surface of the wafer. This polishing process is often referred to as mechanical planarization (MP) and is utilized to improve the quality and reliability of semiconductor devices. The polishing process may also involve the introduction of a chemical slurry to facilitate higher removal rates, along with the selective removal of materials fabricated on the semiconductor wafer. This polishing process is often referred to as chemical mechanical planarization or chemical mechanical polishing (CMP).

In these polishing processes, it is often important to determine an endpoint of the polishing process. Overpolishing (removing too much) of a conductive layer results in increased circuit resistance and potential scrapping of the semiconductor wafer. Since many processing steps have occurred prior to the polishing process, scrapping a semiconductor wafer during fabrication may undesirably result in significant financial loss. Underpolishing (removing too little) of a conductive layer on the other hand leads to failure in isolating circuits and results in electrical shorts. Presence of such electrical shorts leads to rework (redoing the CMP process) thereby disadvantageously increasing costs (e.g. production costs) associated with the semiconductor wafer. Thus, a precise endpoint detection technique is needed.

A typical method employed for determining the endpoint in polishing systems is to measure the amount of time needed to planarize a first wafer, and thereafter polishing the remaining wafers for a similar amount of time. In practice this method is extremely time consuming since machine operators must inspect each wafer after polishing. In particular, it is extremely difficult to precisely control the removal rate of material since the removal rate may vary during the polishing of an individual wafer. Moreover, the removal rate may be diminished in the process of polishing a number of wafers in sequence.

Another approach employed for determining the endpoint in polishing systems is to utilize an optical end point method. Generally, optical end point methods include the use of an optical unit, a control system (i.e. a computer) to control the polishing process, and a layer of material positioned on the semiconductor wafer which has a predetermined reflectivity characteristic. With respect to the reflectivity characteristics of a material, some materials absorb light as opposed to reflecting it, these types of materials have a relatively low reflectivity. On the other hand, some materials reflect light as opposed to absorbing it, these types of materials possess a relatively high reflectivity. Therefore, a material having a predetermined reflectivity characteristic, such as high reflectivity, can be selected and layered onto a semiconductor wafer at a position which represents the desired end point of the polishing process. In addition, the material having the predetermined reflectivity is positioned underneath at least one other layer of material which has a different reflectivity characteristic. As the polishing procedure proceeds, the superimposed layer is gradually removed so as to expose the material having the predetermined reflectivity to a laser beam generated by the optical unit. Once the material having the predetermined reflectivity is exposed, it reflects the laser beam such that the optical detector detects the characteristic reflection and terminates the polishing process in response thereto.

However, a problem with optical end point methods is that they do not work well with semiconductor wafers having patterns or trenches defined therein. For example, optical end point methods do not work well with semiconductor wafers fabricated utilizing a shallow trench isolation (STI) process. Specifically, the previously discussed characteristic reflection which terminates the polishing process is difficult to detect on a semiconductor wafer fabricated utilizing an STI process. In particular, the characteristic reflection tends to be relatively weak and thus difficult to detect. Therefore, it is more likely that the polishing process will not be terminated at the appropriate time which results in damage to the semiconductor wafer.

Thus, a continuing need exists for a method which accurately and efficiently detects when a polishing system polishes a semiconductor device down to a desired polishing endpoint layer. Moreover, a continuing need exists for a method which accurately and efficiently detects when a polishing system polishes a semiconductor device having patterns or trenches defined therein down to a desired polishing endpoint layer.

SUMMARY OF THE INVENTION

In accordance with one embodiment of the present invention, there is provided a method of planarizing a semiconductor wafer that includes (i) a substrate material, (ii) a first reflective substance positioned on the substrate material, (iii) an intermediate material positioned on the first reflective substance, wherein a channel is defined in a structure which includes the substrate, the first reflective substance, and the intermediate material, and (iv) a second reflective substance positioned on the intermediate material and in the channel. The method includes the steps of (i) directing light onto a first side of the semiconductor wafer, (ii) polishing the first side of the semiconductor wafer in order to remove matter therefrom and expose the first reflective substance, the matter including the second reflective substance and the intermediate material, (iii) detecting when light directed in the directing step is simultaneously reflected by (A) the first reflective substance positioned on the substrate, and (B) the second reflective substance positioned in the channel, and generating an endpoint detection signal in response thereto, and (iv) terminating the polishing step in response to generation of the endpoint detection signal.

Pursuant to another embodiment of the present invention, there is provided a method of planarizing a semiconductor wafer that includes (i) a substrate material, (ii) a first reflective substance positioned on the substrate material, (iii) an intermediate material positioned on the first reflective substance, wherein a channel is defined in a structure which includes the substrate, the first reflective substance, and the intermediate material, and (iv) a second reflective substance positioned on the intermediate material and in the channel. The method includes the steps of (i) directing light onto a first side of the semiconductor wafer, (ii) polishing the first side of the semiconductor wafer in order to remove matter therefrom and expose the first reflective substance, the matter including the second reflective substance and the intermediate material, (iii) obtaining a first reflectivity measurement of the first side of the semiconductor wafer at a first point in time, (iv) obtaining a second reflectivity measurement of the first side of the semiconductor wafer at a second point in time, (v) detecting if the second reflectivity measurement is greater than the first reflectivity measurement and generating a polishing endpoint signal if the second reflectivity measurement is greater than the first reflectivity measurement, and (vi) terminating the polishing step in response to generating the polishing endpoint signal.

Pursuant to still another embodiment of the present invention, there is provided an apparatus for polishing a wafer that includes (i) a substrate material, (ii) a first reflective substance positioned on the substrate material, (iii) an intermediate material positioned on the first reflective substance, wherein a channel is defined in a structure which includes the substrate, the first reflective substance, and the intermediate material, and (iv) a second reflective substance positioned on the intermediate material and in the channel. The apparatus includes a polishing platen having a polishing surface. The apparatus also includes a wafer carrier configured to (i) engage the wafer by a second side of the wafer and (ii) press a first side of the wafer against the polishing surface of the polishing platen. The apparatus further includes (A) an optical unit operable to direct a laser light onto the first side of the wafer and (B) an optical detector operable to detect when the first reflective substance and the second reflective substance positioned in the channel simultaneously reflect the laser light.

It is an object of the present invention to provide a new and useful apparatus and method of planarizing a semiconductor wafer.

It is an object of the present invention to provide an improved apparatus and method of planarizing a semiconductor wafer.

It is a further object of the present invention to provide an apparatus and method of planarizing a semiconductor wafer without removing the wafer from the polishing system.

It is yet another object of the present invention to provide an apparatus and method of planarizing a semiconductor wafer which can be utilized with semiconductor wafers that have patterns or trenches defined therein.

It is still another object of the present invention to provide an apparatus and method of planarizing a semiconductor wafer which can be utilized with semiconductor wafers fabricated utilizing a shallow trench isolation (STI) process or an inter layer metal dielectric process.

The above and other objects, features, and advantages of the present invention will become apparent from the following description and the attached drawings.

DETAILED DESCRIPTION OF THE PREFERRED EMBODIMENT

Figure 1A:
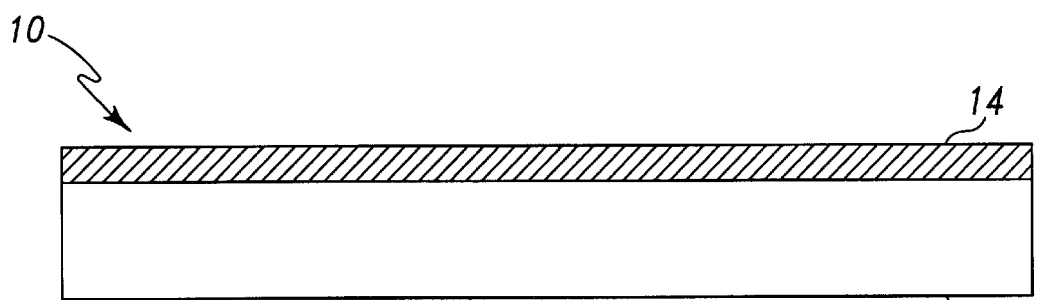
FIGS. 1A–1F show sectional views of a semiconductor wafer during various steps of a fabrication process.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Figure 1B:
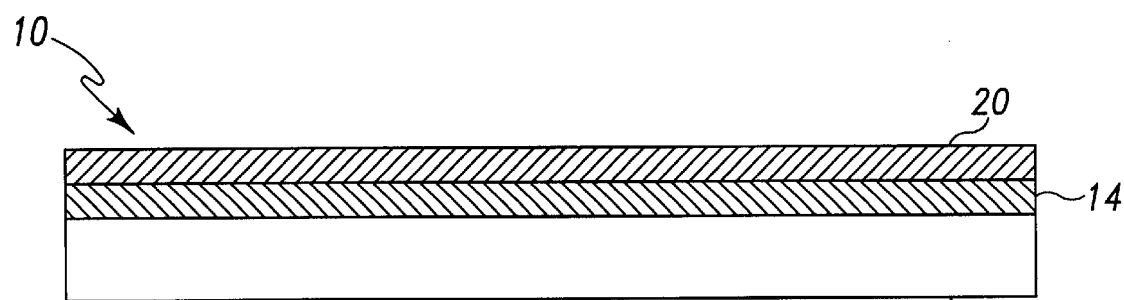

Referring now to FIGS. 1A–1F, there is shown a semiconductor wafer 10 after various steps of a fabrication process of the present invention. In particular, FIGS. 1A and 1B show the semiconductor wafer 10 after a number of fabrication steps. The semiconductor wafer 10 includes a semiconductor substrate 12, such as silicon. A insulating layer 14 is deposited or otherwise disposed (e.g. grown) on the semiconductor substrate 12. In particular, the fabrication process deposits an insulating material 14, such as silicon dioxide, over the substrate 12 as shown in FIG. 1A.

As shown in FIG. 1B, the fabrication process positions a reflective substance 20 on semiconductor substrate 12. In particular, the fabrication process deposits the reflective substance 20 over the insulating layer 14. (Note that for the purposes of this disclosure the reflective substance 20 is still considered to be "positioned on" semiconductor substrate 12 even though insulating layer 14 is interposed between reflective substance 20 and semiconductor substrate 12. In other words, the phrase "positioned on" as used herein does not require the substance or material to be in direct contact with another substance or material on which it is considered to be positioned as long as the substance or material is being supported by the other substance or material.) As shall be discussed below in more detail, the reflective substance functions as a portion of an optical end point layer for a polishing system 30. What is meant herein by a reflective substance is a substance possessing a relatively high reflectivity. What is meant herein by reflectivity is the ratio of the energy carried by a wave (e.g. a light wave) which is reflected from a surface of a substance to the energy carried by the wave which is incident on the surface of the substance. For example, some substances absorb a greater proportion of the incident light as compared to the proportion reflected, therefore these types of substances have a relatively low reflectivity value. On the other hand, some substances reflect a greater proportion of the light as compared to the proportion absorbed, therefore these types of substances possess a relatively high reflectivity value. Examples of substances that can be utilized as the reflective substance 20 in the present invention include silicon nitride and polysilicon. However, other substances are contemplated as long as the substance can function as a portion of the optical end point layer for the polishing system 30. In addition, it should be understood that the reflectivity of a reflective substance layered on a substrate can be adjusted by the thickness of the layer of the reflective substance. Therefore, the reflectivity of a layer of a reflective substance can be optimized by adjusting the thickness of the layer.

Reflective substance 20 may be deposited on the insulating layer 14 with any one of a number of know techniques. For example, reflective substance 20 may be deposited on the insulating layer 14 via chemical vapor deposition.

Figure 1C:
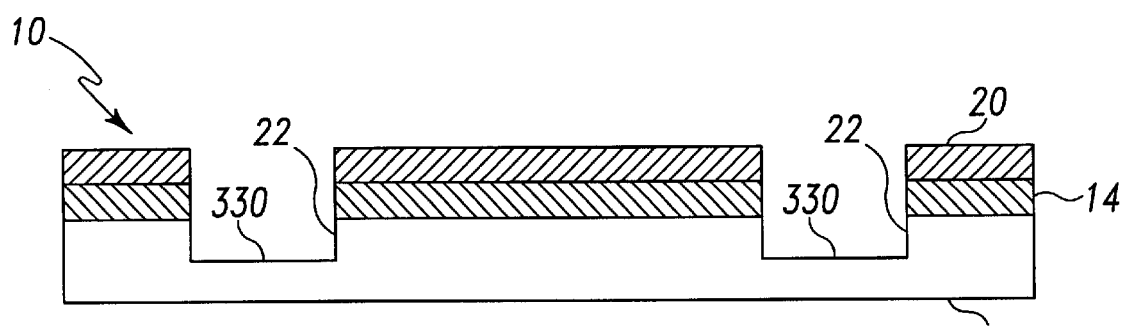

Thereafter, as shown in FIG. 1C, a number of trenches 22 are etched or otherwise formed in the semiconductor wafer 12. Each trench 22 has a floor surface 330. The trenches 22 may be formed by first applying a photo-resist or other type of etching mask to the desired areas of the semiconductor wafer 10 and thereafter chemically etching the unmasked areas of the insulating layer 14 and the substrate 12. Such etching masks and techniques for use thereof are commonly known in the art.

Figure 1D:
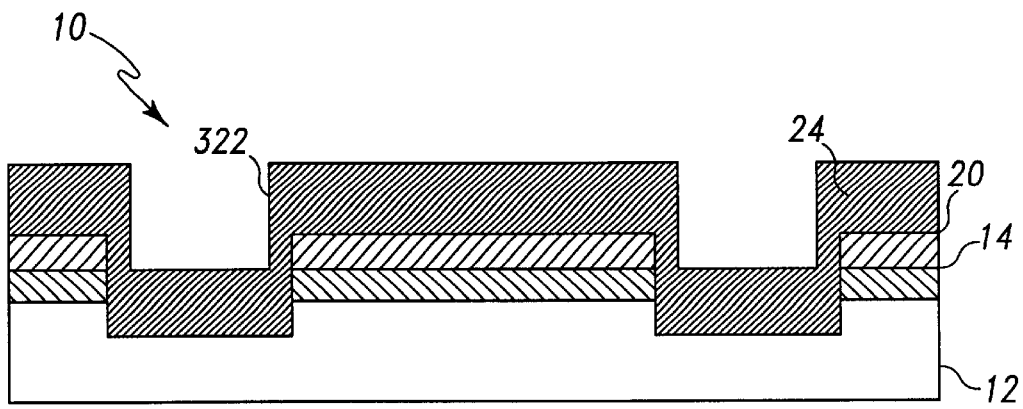

As shown in FIG. 1D, once the reflective substance 20 is deposited onto semiconductor wafer 10, and the trenches 22 are defined therein, an intermediate material 24 is deposited on the semiconductor wafer 10. In particular, the intermediate material 24 is deposited on the reflective substance 20 and the semiconductor wafer 10 such that reflective substance 20 is interposed between the semiconductor substrate 12 and the intermediate material 24. Deposition of the intermediate material 24 also causes the trenches 22 to be filled with the material of the intermediate material 24. Preferably, the material of the intermediate material 24 is an insulating material, such as an oxide (e.g. silicon oxide) deposited utilizing a high density plasma process. Moreover, it should be appreciated that depositing intermediate material 24 in the above described manner results in channels 322 being defined in a structure which includes substrate 12, reflective substance 20, and intermediate material 24. In addition, depositing intermediate material 24 in the above described manner results channels 322 being positioned directly above the trenches 22 defined in semiconductor substrate 12.

Figure 1E:
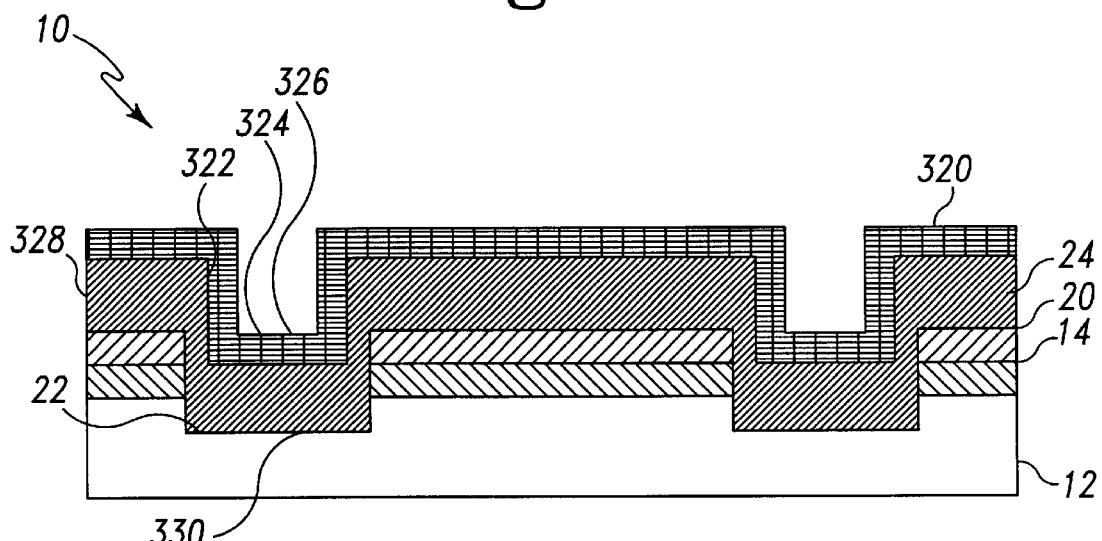

As shown in FIG. 1E, a reflective substance 320 is then deposited onto semiconductor wafer 10. As shall be discussed below in more detail, the reflective substance 320 functions as another portion of the optical end point layer for the polishing system 30. Examples of substances that can be utilized as the reflective substance 320 in the present invention include silicon nitride and polysilicon. However, other substances are contemplated as long as the substance can function as a portion of the optical end point layer for the polishing system 30. In addition, it should be understood that reflective substance 20 and reflective substance 320 can be made from the same substance or two different substances. For example, reflective substance 20 and reflective substance 320 can both include silicon nitride. On the other hand, reflective substance 20 can include silicon nitride while reflective substance 320 can include polysilicon.

Reflective substance 320 is deposited on the intermediate material 24 and the semiconductor wafer 10 such that intermediate material 24 is interposed between the reflective substance 20 and the reflective substance 320. In addition, deposition of the reflective substance 320 in the above described manner causes the channels 322 defined in intermediate material 24 to contain reflective substance 320. In particular, deposition of the reflective substance 320 in the above described manner causes a channel portion 324 of reflective substance 320 to be positioned at the bottom of the channel 322. Preferably, channel portion 324 of reflective substance 320 is positioned at the bottom of the channel 322 such that an upper surface 326 is substantially coplanar with an upper surface 328 of reflective substance 20. Furthermore, channel portion 324 is positioned vertically above the floor surface 330 of trench 22. It should be understood that reflective substance 320 is not interposed between any two layers of material, and thus is exposed to the surrounding environment.

It should be appreciated that, preferably, reflective substance 20 has a reflectivity value of $\alpha$, intermediate material 24 has a reflectivity value of $\beta$, and reflective substance 320 has a reflectivity value of $\theta$. In addition, it should be understood that (i) the reflectivity value $\alpha$ is greater than the reflectivity value $\beta$ and (ii) the reflectivity value $\theta$ is greater than the reflectivity value $\beta$.

Figure 1F:
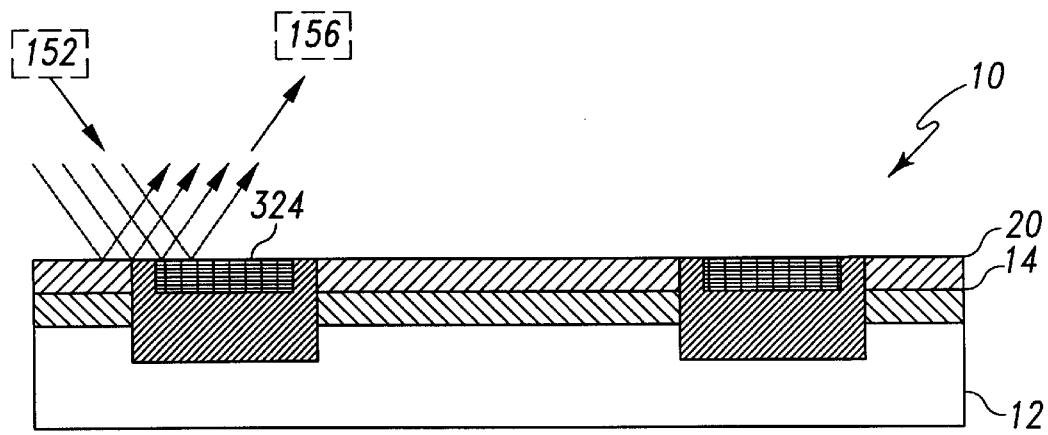
Figure 2:
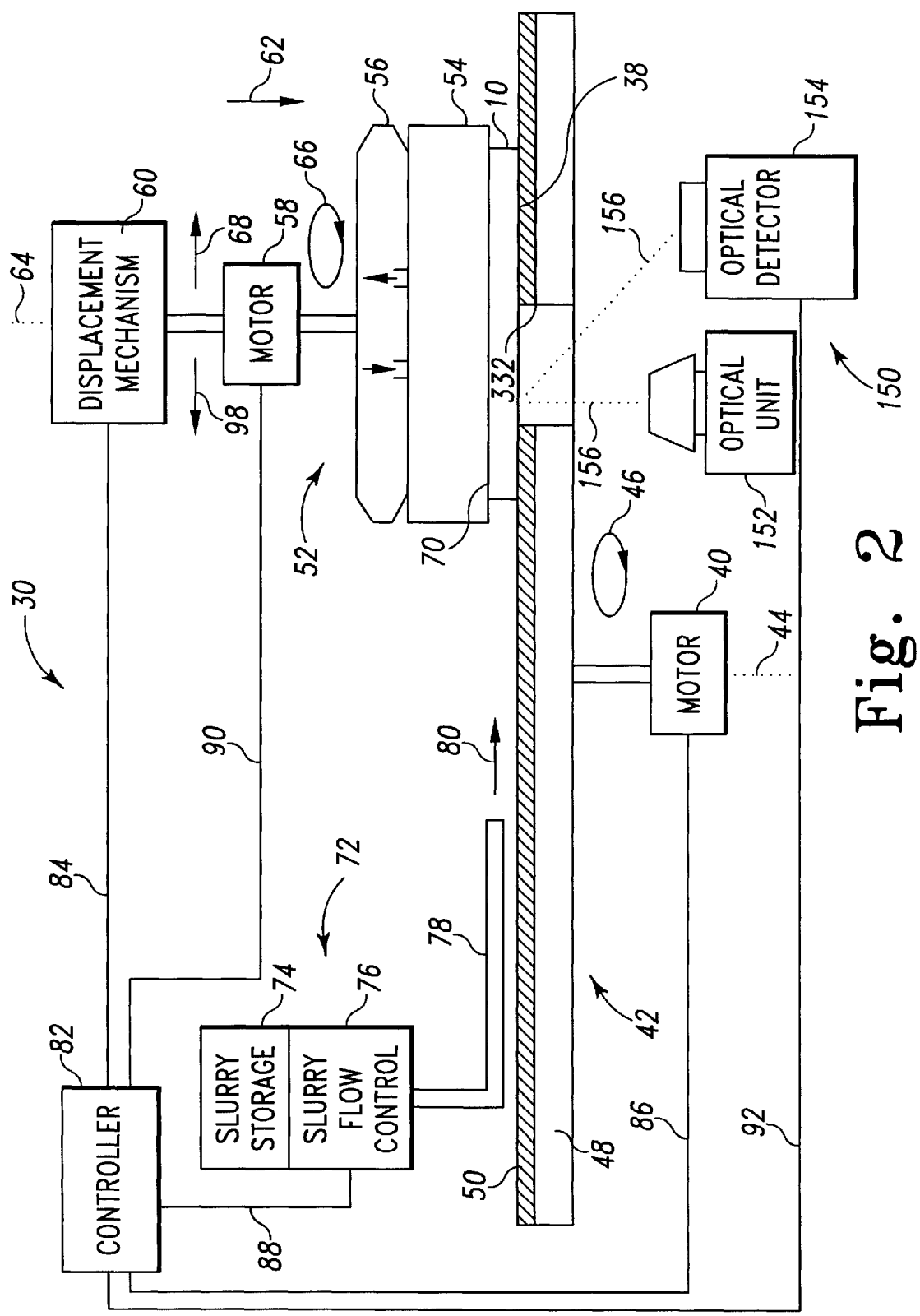
FIG. 2 shows an embodiment of a polishing system which incorporates various features of the present invention therein.

Thereafter, as shown in FIG. 1F, a polishing system, such as the polishing system 30 of FIG. 2, polishes the semiconductor wafer 10 down to the reflective substance 20 and the channel portion 324 of reflective substance 320 thereby planarizing semiconductor wafer 10. Such planarization facilitates subsequent processes associated with the fabrication of semiconductor wafer 10.

Referring now to FIG. 2, there is shown a preferred embodiment of the polishing system 30 which is used to planarize a front side or surface 38 of the semiconductor wafer 10. The polishing system 30 includes a platen motor or other drive mechanism 40 and a platen assembly 42. The platen motor 40 rotates the platen assembly 42 about a center axis 44. The platen motor 40 may rotate the platen assembly 42 in a clockwise direction (as shown by arrow 46 of FIG. 2) or in the counterclockwise direction.

The platen assembly 42 includes a polishing platen 48 and a polishing pad 50 mounted on the polishing platen 48. Both the polishing platen 48 and the polishing pad 50 are circular and collectively define a polishing area or surface against which the front side 38 of the semiconductor wafer 10 may be polished. Moreover, the polishing pad 50 is typically made of blown polyurethane which protects the polishing platen 48 from chemical slurry and other chemicals introduced during the polishing process. In addition, polishing platen 48 and polishing pad 50 have a window 332 defined therein which allows the periodic passage of light therethrough. In particular, as polishing platen 48 and polishing pad 50 rotate in the above described manner, a light can periodically pass through window 332 and be reflected off of the front side 38 of semiconductor wafer 10.

The polishing system 30 also includes a polishing head assembly 52. The polishing head assembly 52 includes a wafer carrier 54, a cooling mechanism 56, a wafer carrier motor or other drive mechanism 58, and a wafer carrier displacement mechanism 60. The displacement mechanism 60 applies a controlled, adjustable force in the general direction of arrow 62 in order to press the front side 38 of the semiconductor wafer 10 into contact with the polishing pad 50 so as to facilitate polishing of the front side 38 of the semiconductor wafer 10. It should be appreciated that the front side 38 of semiconductor wafer 10 has the above discussed reflective substance 20, reflective substance 320, and intermediate material 24 disposed thereon.

The wafer carrier motor 58 rotates the wafer carrier 54 and the semiconductor wafer 10 about a center axis 64. The wafer carrier motor 58 may rotate the wafer carrier 54 in a clockwise direction (as shown by arrow 66 of FIG. 2) or in the counterclockwise direction. However, the wafer carrier motor 58 preferably rotates the wafer carrier 54 in the same rotational direction as the platen motor 40 rotates the platen assembly 42 (although the wafer carrier motor 58 may rotate the semiconductor wafer 10 in the rotational direction opposite the rotational direction of the platen assembly 42 as desired).

The wafer carrier 54 also includes mechanisms (not shown) for holding the semiconductor wafer 10. For example, the wafer carrier 54 may include a vacuum-type mechanism which generates a vacuum force that draws the semiconductor wafer 10 against the wafer carrier 54. Once the semiconductor wafer 10 is positioned on the wafer carrier 54 and held in contact with the platen assembly 42 for polishing, the vacuum force may be removed. In such an arrangement, the wafer carrier 54 may be designed with a friction surface or a carrier pad which engages a back side 70 of the semiconductor wafer 10. Such a carrier pad, along with the force being applied in the general direction of arrow 62, creates a frictional force between the wafer carrier 54 and the semiconductor wafer 10 that effectively holds the semiconductor wafer 10 against the wafer carrier 54 thereby causing the semiconductor wafer 10 to rotate at the same velocity as the wafer carrier 54. It should be appreciated that such wafer carriers and carrier pads are of conventional design and are commercially available.

The cooling mechanism 56 counteracts heat generated during the polishing process in order to maintain the wafer carrier 54 at a substantially constant temperature. In particular, the cooling mechanism 56 reduces the heat generated due to friction and a chemical slurry reacting with the front side 38 of the semiconductor wafer 10.

The displacement mechanism 60 selectively moves the wafer carrier 54 and hence the semiconductor wafer 10 across the platen assembly 42 in the general direction of arrows 68 and 98. Such movement defines a polishing path which may be linear, sinusoidal, or a variety of other patterns. The wafer carrier displacement mechanism 60 is also capable of moving the semiconductor wafer 10 along a polishing path to a location beyond the edge of the polishing pad 50 so that the semiconductor wafer 10 "overhangs" the edge. Such an overhanging arrangement permits the semiconductor wafer 10 to be moved partially on and partially off the polishing pad 50 to compensate for polishing irregularities caused by a relative velocity differential between the faster moving outer portions and the slower moving inner portions of the platen assembly 42.

The polishing system 30 also includes a chemical slurry system 72. The slurry system 72 includes a slurry storage reservoir 74, a slurry flow control mechanism 76, and a slurry conduit 78. The slurry storage reservoir 74 includes one or more containers for storing slurry. In particular, the slurry storage reservoir 74 contains a chemical slurry that includes abrasive material which facilitates polishing of the front side 38 of the semiconductor wafer 10. Chemical slurries having such properties are well known and commercially available.

The slurry flow control mechanism 76 controls the flow of slurry from the slurry storage 74, through the slurry conduit 78, and onto the polishing area atop the platen assembly 42. Hence, the slurry flow control mechanism 76 and the slurry conduit 78 selectively introduce a flow of slurry (as indicated by arrow 80) atop the polishing pad 50.

The polishing system 30 also includes an endpoint detection system 150. The endpoint detection system 150 includes an optical unit 152 and an optical detector 154. Optical unit 152 is operable to generate and direct a laser light 156 through window 332 and onto the front side 38 of the semiconductor wafer 10. Preferably optical unit generates a laser light having a wave length of 638 nm. Optical detector 154 is operable to detect the laser light 156 reflected off of the front side 38 of the semiconductor wafer 10. Optical detector 154 is also capable of calculating a reflectivity value for the front side 38 of the semiconductor wafer 10. Optical detector 154 is also capable of generating an endpoint detection signal in response to calculating the reflectivity value for the front side 38 of the semiconductor wafer 10.

The polishing system 30 also includes a controller 82 for controlling the polishing system 30 in order to effectuate the desired polishing results for the semiconductor wafer 10. In particular, the controller 82 is electrically coupled to the displacement mechanism 60 via a signal line 84 to monitor and controllably adjust the polishing path of the semiconductor wafer 10 and the speed at which the semiconductor wafer 10 is moved across the platen assembly 42.

Moreover, the controller 82 is electrically coupled to the platen motor 40 via a signal line 86 in order to monitor the output speed of the platen motor 40 and hence the rotational velocity of the platen assembly 42. The controller 82 adjusts the output speed of the platen motor 40 and hence the rotational velocity of the platen assembly 42 as required by predetermined operating parameters.

The controller 82 is electrically coupled to the slurry flow control mechanism 76 via a signal line 88 in order to monitor the flow rate of the chemical slurry onto the polishing pad 50 of the platen assembly 42. The controller 82 adjusts the flow rate of the chemical slurry onto the polishing pad 50 of the platen assembly 42 as required by predetermined operating parameters.

The controller 82 is electrically coupled to the wafer carrier motor 58 via a signal line 90 in order to monitor the output speed of the wafer carrier motor 58 and hence the rotational velocity of the wafer carrier 54. The controller 82 adjusts the output speed of the wafer carrier motor 58 and hence the rotational velocity of the wafer carrier 54 as required by predetermined operating parameters.

The controller 82 is electrically coupled to the optical detector 154 via a signal line 92 in order to monitor the endpoint detection signal generated by the optical detector 154. In particular, when optical detector 154 detects that the reflective substance 20 and the channel portion 324 of reflective substance 320 are simultaneously reflecting the laser light 156 emitted from optical unit 152, the optical detector 154 generates an endpoint detection signal which is communicated to the controller 82 via the signal line 92. For example, one way optical detector 154 can generate an endpoint detection signal when the above described simultaneous reflection occurs is to program optical detector 154 such that the end point detection signal is generated when the reflectivity of the front side 38 of the semiconductor wafer 10 is equal to or exceeds a predetermined value. In the alternative, optical detector 154 can be programmed to sequentially take a first and a second reflectivity measurement and generate an endpoint detection signal in response to the second reflectivity measurement having a value which is a predetermined amount greater than the first reflectivity measurement.

In operation, the polishing system 30 polishes the semiconductor wafer 10 in order to planarize the front side 38 thereof. More specifically, the wafer carrier 54 engages the back side 70 of the semiconductor wafer 10 and presses the front side 38 of the semiconductor wafer 10 against the polishing pad 50. The controller 82 then causes the platen motor 40 to rotate the platen assembly 42 and the wafer carrier motor 58 to rotate the wafer carriers 54. The controller 82 may also begin to control the displacement mechanism 60 so as to move the wafer carrier 54 along a predetermined polishing path. The slurry flow control mechanism 76 is also controlled by the controller 82 in order to apply chemical slurry to the polishing pad 50 at a predetermined flow rate. The resulting complex movement of the wafer carrier 54 relative to the polishing pad 50, the force being applied to the semiconductor wafer 10 in the general direction of arrow 62 of FIG. 2, and the chemical slurry all cooperate to selectively remove material from the front side 38 of the semiconductor wafer 10.

In particular, the polishing system 30 initially removes the portion of reflective substance 320 which is located out side of the channel 322 (see FIG. 1E). The polishing system 30 then removes the intermediate material 24 and the reflective substance 320 located on the side walls of channel 322. The polishing system 30 continues until semiconductor wafer 10 is polished down to the reflective substance 20 and the channel portion 324 of reflective substance 320 as shown in FIG. 1F. It should be appreciated that polishing semiconductor wafer 10 in the above described manner exposes reflective substance 20 such that laser light 156 can be reflected off of reflective substance 20. It should also be appreciated that polishing semiconductor wafer 10 in the above described manner allows both reflective substance 20 and the channel portion 324 of reflective substance 320 to function as the optical end point layer for the polishing system 30.

Figure 4:
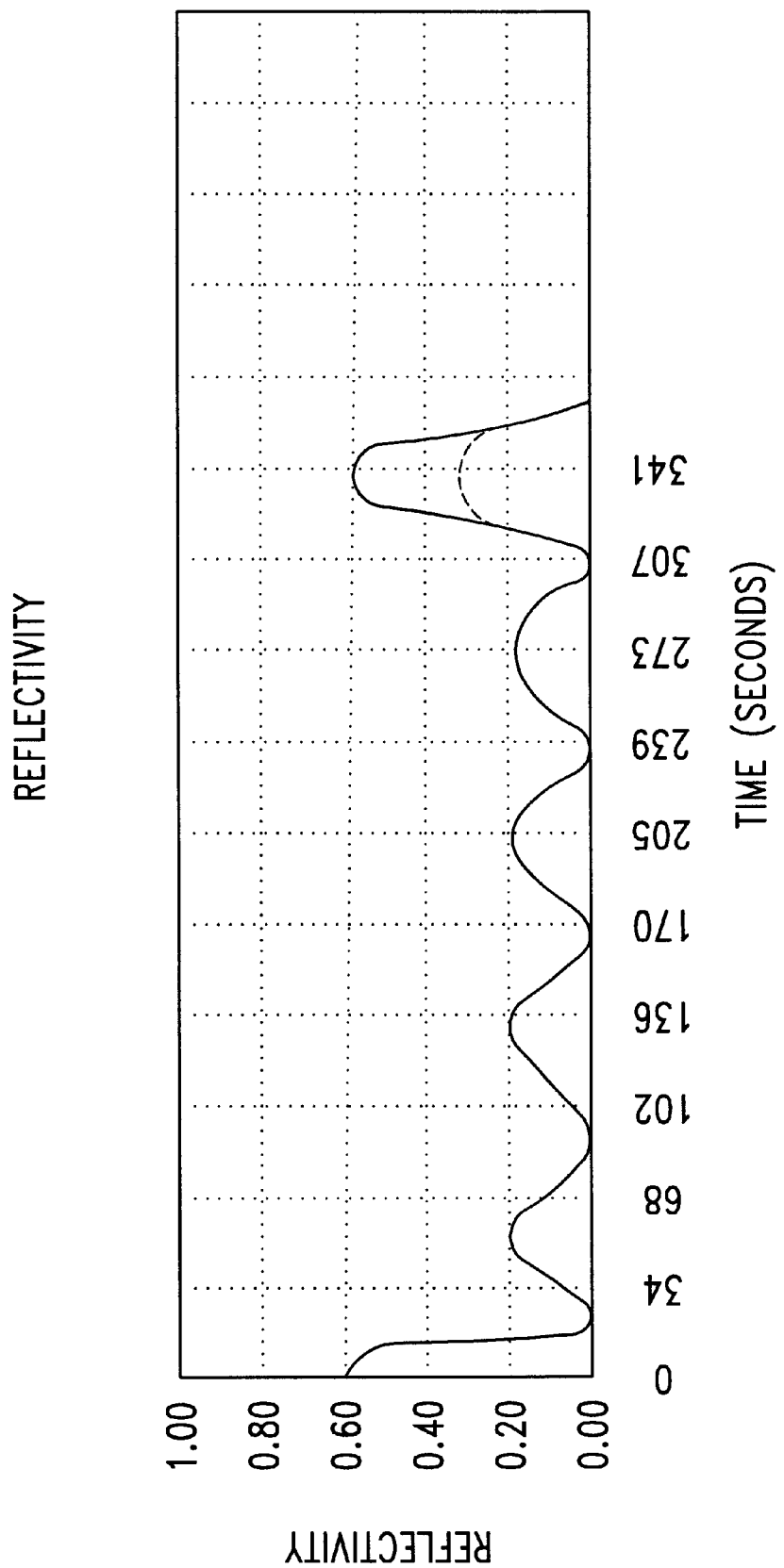
FIG. 4 is a graph showing the reflectivity value of a surface of a semiconductor wafer during a polishing process performed by the polishing system of FIG. 2.

It should be understood that as polishing pad 50 and polishing platen 48 rotate in the above described manner window 332 is periodically positioned relative to optical unit 152 such the laser light 156 can be reflected off of the front side 38 of the semiconductor wafer 10. Therefore, optical detector 154 can periodically calculate a reflectivity value for the front side 38 of the semiconductor wafer 10. As shown in FIG. 4, a graph depicting the reflectivity value for the front side 38 of the semiconductor wafer 10 at various times during the polishing process can be generated with the above described arrangement. Specifically, as shown in FIG. 4, the reflectivity value for the front side 38 is relatively high (i.e. 0.60) early in the polishing process due to the laser light 156 reflecting off of reflective substance 320. The is true since reflective substance 320 has a relatively large reflectivity value as previously discussed. However, as the polishing process proceeds, the portion of reflective substance 320 not positioned within the channels 322 is removed, therefore, only the portion of reflective substance 320 positioned within the channels and the intermediate material 24 reflect the laser light 156. (Note that reflectivity substance 20 has not been exposed by the polishing process yet and thus can not effectively reflect laser light 156.) Since a large proportion of the surface area of reflective substance 320 has been removed, and the intermediate material 24 is a relatively low reflective substance, the next reflectivity measurement taken by optical detector 154 at about 50 seconds into the polishing process drops significantly to approximately 0.20. The reflectivity value remains relatively low, i.e. approximately 0.20, until the polishing system 30 polishes down to, and exposes, reflective substance 20. Specifically, the polishing system 30 polishes down to, and begins to expose reflective substance 20 at about 307 seconds into the polishing process. It should be understood that once the polishing system 30 polishes down to, and exposes, reflective substance 20, reflective substance 20 and the channel portion 324 of reflective substance 320 combine to form an optical end point layer for a polishing system 30. That is, reflective substance 20 and the channel portion 324 of reflective substance 320 can both simultaneously reflect the laser light 156 once the polishing system 30 polishes down to, and exposes, reflective substance 20 as schematically depicted in FIG. 1F. It should be appreciated that combining the exposed reflective substance 20 and the exposed channel portion 324 of reflective substance 320 results in an optical end point layer having a relatively large surface area and a relatively high reflectivity. Therefore, as shown at about 335 seconds into the polishing process, the reflectivity value for the front side 38 of the semiconductor wafer 10 significantly increases to approximately 0.60.

It should be appreciated that having reflective substance 20 and channel portion 324 of reflective substance 320 combine to form the optical end point layer for a polishing system 30 is an advantage of the present invention since it results in a relatively large, easily detectable, change in the reflectivity value for the front side 38 of the semiconductor wafer 10 which can be utilized to trigger an end point detection signal for polishing system 30. This is in contrast to other optical end point methods which utilize a single reflective substance layer for the optical end point layer. For example, if reflective substance 20 was the only layer of reflective substance utilized for the optical end point layer, the surface area of the optical end point layer would be relatively small since the channel portions 324 of reflective substance 320 would be absent. As a result of having a relatively small surface area, the change in the reflectivity value for the front side 38 of the semiconductor wafer 10 at the polishing end point would also be relatively small as depicted by the dotted line in FIG. 4. Having a relatively small change in the reflectivity value for the front side 38 of the semiconductor wafer 10 makes it more difficult to detect when the polishing system 30 has reached the desired polishing end point as opposed to when the change in reflectivity is large, as when two separate layers of reflecting substances (i.e. reflecting substances 20 and 320) are combined to form the polishing end point layer.

It should also be appreciated that under certain circumstances it is preferable to have the reflectivity value of reflective substance 20 (i.e. $\alpha$) be greater than the reflectivity value of reflective substance 320 (i.e. $\theta$). For example, when the pattern layer density of reflective substance 20 drops from about 50% to about 5% then it is preferable to have reflective substance 20 be more reflective than reflective layer 320 (and thus channel portions 324). In other words, if the semiconductor wafer 10 has a large number of trenches 22 defined therein, then the surface area of reflective substance 20 will be relatively small, this decrease in the surface area of reflective substance 20 needs to be accounted for by having the reflectivity value of reflective substance 20 (i.e. $\alpha$) be greater than the reflectivity value of reflective substance 320 (i.e. $\theta$).

It should further be appreciated that based upon the sinusoidal curve generated by the polishing system 30 of the present invention the rate of removing matter from the front side 38 of the semiconductor wafer 10 can be calculated. In particular, the magnitude of each reflectivity measurement can be used to calculate the thickness of the layer being removed. Thus, obtaining a series of reflectivity measurements over a period of time allows the matter removal rate to be calculated.

The optical detector 154 generates an endpoint detection signal once the optical detector 154 detects the above described change in the reflective value for the front side 38 of the semiconductor wafer 10. In response to the optical detector generating the endpoint detection signal, the controller 82 terminates the polishing of the semiconductor wafer 10 since the semiconductor wafer 10 has been polished down to the reflective substance 20 and the channel portions 324 of reflective substance 320 thereby creating a planar surface for subsequent fabrication processes.

Once semiconductor wafer 10 has been polished in the above manner, the reflective substance 20 and the channel portions 324 are chemically removed. For example, if silicon nitride is utilized for a reflective substance, the sodium nitride can be remove with a phosphoric acid bath heated to about 50° to 70° Celsius. Alternatively, if polysilicon is utilized for a reflective substance, the polysilicon can be oxidized to silicon dioxide in a well known manner.

Figure 3:
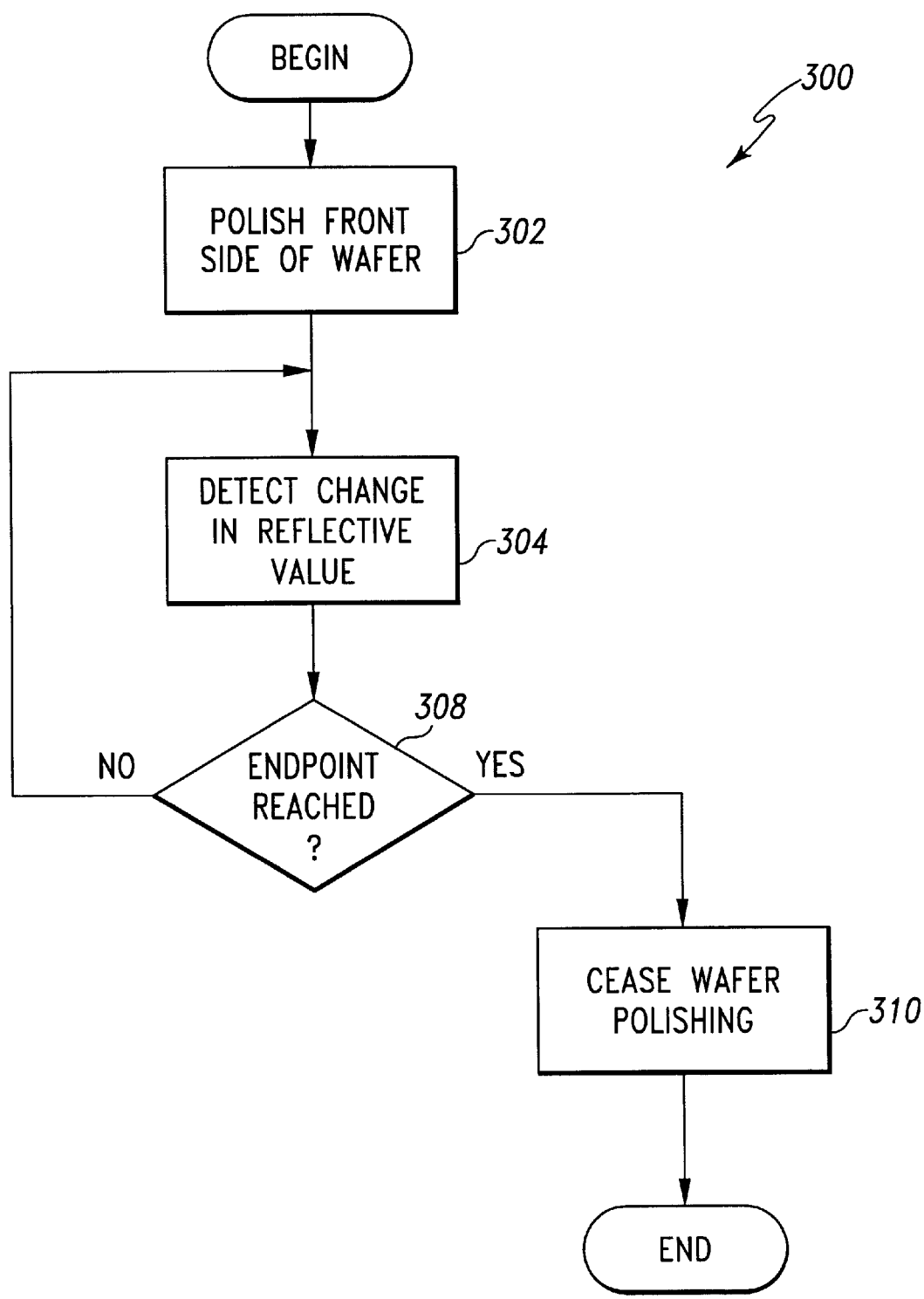
FIG. 3 shows a flowchart of a polishing procedure used by the polishing system of FIG. 2.

A polishing procedure 300 utilized by the polishing system 30 to polish the semiconductor wafer 10 according to the present invention is shown in FIG. 3. The polishing procedure 300 begins with step 302 in which the controller 82 causes the polishing system 30 to begin polishing the front side 38 of the semiconductor wafer 10 in order to remove material therefrom. In particular, the controller 82 actuates the platen motor 40 in order to cause the platen assembly 42 to be rotated. Thereafter, the controller 82 actuates the wafer carrier motor 58 thereby causing the wafer carrier 54 and hence the semiconductor wafer 10 to be rotated so as to rub the front side 38 of the semiconductor wafer 10 against the rotating platen assembly 42. The controller 82 also actuates the displacement mechanism 60 in order to cause the displacement mechanism 60 to selectively move the wafer carrier 54 and hence the wafer 10 along a predetermined polishing path. Moreover, the controller 82 causes the chemical slurry supply system 72 to apply chemical slurry to the polishing pad 50 of the platen assembly 42 in order to facilitate the removal of material from the front side 38 of the semiconductor wafer 10. The procedure 300 then advances to step 304.

In step 304, the optical detector 154 determines if the wafer 10 has been polished down to the reflective substance 20 and the channel portion 324 of reflective substance 320. In particular, if the optical detector 154 detects a predetermined change in the magnitude of the reflective value for the front side 38 of the semiconductor wafer 10, the optical detector 154 generates an endpoint detection control signal which is communicated to the controller 82. Hence, if the optical detector 154 generates an endpoint detection control signal, the procedure 300 advances to step 308. If the optical detector 154 has not generated an endpoint detection control signal, the procedure 300 loops back to step 304 to determine if the wafer 10 has been polished down to the reflective substance 20 and the channel portion 324 of reflective substance 320.

In step 308, the controller 82 ceases polishing of the wafer 10. In particular, the controller 82 communicates with the platen motor 40, the wafer carrier motor 58, the displacement mechanism 60, and the slurry flow control 76 in order to cease polishing of the semiconductor wafer 10. However, it should be appreciated that the controller 82 may allow the polishing system 30 to continue polishing the semiconductor wafer 10 for a short, predetermined amount of time subsequent to generation of the endpoint detection control signal in order to further remove material from the semiconductor wafer 10. This further removal of material or overpolishing may be desirable after certain steps of a fabrication process. The procedure 300 then ends thereby placing the polishing system 30 in an idle state until actuated to polish a subsequent semiconductor wafer.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected.

What is claimed is:

1. A method of planarizing a semiconductor wafer that includes (i) a substrate material, (ii) a first reflective substance positioned on said substrate material, (iii) an intermediate material positioned on said first reflective substance, wherein a channel is defined in a structure which includes said substrate, said first reflective substance, and said intermediate material, and (iv) a second reflective substance positioned on said intermediate material and in said channel, comprising the steps of:

directing light onto a first side of said semiconductor wafer;

polishing said first side of said semiconductor wafer in order to remove matter therefrom and expose said first reflective substance, said matter including said second reflective substance and said intermediate material;

detecting when light directed in said directing step is simultaneously reflected by (i) said first reflective substance positioned on said substrate, and (ii) said second reflective substance positioned in said channel, and generating an endpoint detection signal in response thereto; and terminating said polishing step in response to generation of said endpoint detection signal.

2. The method of claim 1, wherein:

said intermediate material includes an insulating material.

3. The method of claim 1, wherein:

said first reflective substance has a reflectivity $\alpha$, said intermediate material has a reflectivity $\beta$, said second reflective substance has a reflectivity $\theta$, said reflectivity $\alpha$ is greater than said reflectivity $\beta$, and said reflectivity $\theta$ is greater than said reflectivity $\beta$.

4. The method of claim 1, wherein:

said first reflective substance and said second reflective substance are made from the same substance.

5. The method of claim 5, wherein:

said first reflective substance includes silicon nitride, and said second reflective substance includes silicon nitride.

6. The method of claim 1, wherein:

said intermediate material includes an HDP oxide.

7. The method of claim 1, wherein:

said light directed onto said first side of said semiconductor wafer is generated from a laser.

8. The method of claim 1, wherein:

said second reflective substance is positioned in said channel so that an upper surface of said second reflective substance is substantially coplanar with an upper surface of said first reflective substance.

9. The method of claim 1, wherein:

said polishing step includes the step of applying a slurry to said first side of said semiconductor wafer so as to enhance the removal of said matter therefrom.

10. A method of planarizing a semiconductor wafer that includes (i) a substrate material, (ii) a first reflective substance positioned on said substrate material, (iii) an intermediate material positioned on said first reflective substance, wherein a channel is defined in a structure which includes said substrate, said first reflective substance, and said intermediate material, and (iv) a second reflective substance positioned on said intermediate material and in said channel, comprising the steps of:

directing light onto a first side of said semiconductor wafer;

polishing said first side of said semiconductor wafer in order to remove matter therefrom and expose said first reflective substance, said matter including said second reflective substance and said intermediate material;

obtaining a first reflectivity measurement of said first side of said semiconductor wafer at a first point in time;

obtaining a second reflectivity measurement of said first side of said semiconductor wafer at a second point in time;

detecting if said second reflectivity measurement is greater than said first reflectivity measurement and generating a polishing endpoint signal if said second reflectivity measurement is greater than said first reflectivity measurement; and terminating said polishing step in response to generating said polishing endpoint signal.

11. The method of claim 10, wherein:

said first reflective substance has a reflectivity $\alpha$, said intermediate material has a reflectivity $\beta$, said second reflective substance has a reflectivity $\theta$, said reflectivity $\alpha$ is greater than said reflectivity $\beta$, and said reflectivity $\theta$ is greater than said reflectivity $\beta$.

12. The method of claim 10, wherein:

said polishing step includes the step of removing a quantity of said second reflecting substance prior to when light directed in said directing step is simultaneously reflected by (i) said first reflective substance positioned on said substrate, and (ii) said second reflective substance positioned in said channel.

13. The method of claim 10, wherein:

said first reflective substance includes silicon nitride, and said second reflective substance includes silicon nitride.

14. An apparatus for polishing a wafer that includes (i) a substrate material, (ii) a first reflective substance positioned on said substrate material, (iii) an intermediate material positioned on said first reflective substance, wherein a channel is defined in a structure which includes said substrate, said first reflective substance, and said intermediate material, and (iv) a second reflective substance positioned on said intermediate material and in said channel, comprising:

a polishing platen having a polishing surface;

a wafer carrier configured to (i) engage said wafer by a second side of said wafer and (ii) press a first side of said wafer against said polishing surface of said polishing platen;

an optical unit operable to direct a laser light onto said first side of said wafer; and an optical detector operable to detect when said first reflective substance and said second reflective substance positioned in said channel simultaneously reflect said laser light.

15. The apparatus of claim 14, further comprising:

a slurry supply system configured to apply a chemical slurry to said first side of said wafer which facilities removal of matter from said wafer, wherein said polishing platen and said wafer carrier are configured to rub said first side of said wafer against said polishing surface in the presence of said chemical slurry in order to remove said matter from said wafer.

16. The apparatus of claim of claim 14, wherein:

said optical detector is further operable to (i) obtain a first reflectivity measurement of said first side of said wafer at a first point in time, (ii) obtain a second reflectivity measurement of said first side of said wafer at a second point in time, and (iii) generate a polishing end point detection signal when said second reflectivity measurement has a greater value than said first reflectivity measurement.

17. The apparatus of claim 14, wherein:

said first reflective substance has a reflectivity $\alpha$, said intermediate material has a reflectivity $\beta$, said second reflective substance has a reflectivity $\theta$, said reflectivity $\alpha$ is greater than said reflectivity and said reflectivity $\theta$ is greater than said reflectivity $\beta$.

18. The apparatus of claim of claim 14, wherein:

said second reflective substance is positioned in said channel so that an upper surface of said second reflective substance is substantially coplanar with an upper surface of said first reflective substance.

19. The apparatus of claim 14, wherein:

said first reflective substance includes silicon nitride, and said second reflective substance includes silicon nitride.

20. The apparatus of claim 14, wherein:

said intermediate material includes an HDP oxide.

\* \* \* \* \*